United States Patent
Sim et al.

(10) Patent No.: US 10,880,997 B2
(45) Date of Patent: Dec. 29, 2020

(54) STRETCHABLE MEMBER WITH METAL FOIL

(71) Applicant: HITACHI CHEMICAL COMPANY, LTD., Tokyo (JP)

(72) Inventors: Tangyii Sim, Tokyo (JP); Kumpei Yamada, Tokyo (JP); Takashi Kawamori, Tokyo (JP); Takeshi Masaki, Tokyo (JP)

(73) Assignee: SHOWA DENKO MATERIALS CO., LTD., Tokyo (JP)

( * ) Notice: Subject to any disclaimer, the term of this patent is extended or adjusted under 35 U.S.C. 154(b) by 0 days.

(21) Appl. No.: 16/473,812

(22) PCT Filed: Dec. 21, 2017

(86) PCT No.: PCT/JP2017/045989
§ 371 (c)(1),
(2) Date: Jun. 26, 2019

(87) PCT Pub. No.: WO2018/123818
PCT Pub. Date: Jul. 5, 2018

(65) Prior Publication Data
US 2020/0154563 A1 May 14, 2020

(30) Foreign Application Priority Data

Dec. 27, 2016 (JP) ................ 2016-254032

(51) Int. Cl.
*H05K 1/02* (2006.01)
*H05K 3/06* (2006.01)
*H05K 1/03* (2006.01)
*H05K 1/18* (2006.01)

(52) U.S. Cl.
CPC ......... *H05K 1/0283* (2013.01); *H05K 1/0353* (2013.01); *H05K 3/064* (2013.01); *H05K 3/067* (2013.01); *H05K 1/18* (2013.01)

(58) Field of Classification Search
CPC .... H05K 1/028; H05K 1/0281; H05K 1/0283; H05K 1/0393; H05K 1/189; H05K 3/326; H05K 3/061; H05K 3/062; H05K 3/064; H05K 3/065
See application file for complete search history.

(56) References Cited

U.S. PATENT DOCUMENTS 5,549,964 A * 8/1996 Shohji ................. D04H 1/44
428/375
2011/0005812 A1* 1/2011 Shimokawa .......... H05K 3/384
174/255

FOREIGN PATENT DOCUMENTS

| JP | 2006-147662 A | 6/2006 |
|---|---|---|
| JP | 2013-187380 A | 9/2013 |
| JP | 2015-127117 A | 7/2015 |
| TW | 201633866 A | 9/2016 |
| WO | 2016/080346 A1 | 5/2016 |

* cited by examiner

*Primary Examiner* — Jeremy C Norris
(74) *Attorney, Agent, or Firm* — Fitch, Even, Tabin & Flannery, L.L.P.

(57) ABSTRACT

Disclosed is a stretchable member with a metal foil including a stretchable resin base material, and a conductive metal foil provided on the stretchable resin base material. A surface of the metal foil on the stretchable resin base material side is a roughened surface having surface roughness Ra of 0.1 μm to 3 μm.

8 Claims, 4 Drawing Sheets

STRETCHABLE MEMBER WITH METAL FOIL

CROSS-REFERENCE TO RELATED APPLICATIONS

This application is a U.S. national phase application filed under 35 U.S.C. § 371 of International Application No. PCT/JP2017/045989, filed Dec. 21, 2017, designating the United States, which claims priority from Japanese Application No. 2016-254032, filed Dec. 27, 2016, which are hereby incorporated herein by reference in their entirety.

TECHNICAL FIELD

The present invention relates to a stretchable member with a metal foil.

BACKGROUND ART

Recently, in the field of wearable appliances, appliances relevant to healthcare, and the like, for example, flexibility and stretchability are required for enabling the appliances to be used along a curved surface or a joint portion of the body, and for preventing bad connection due to desorption. In order to configure such appliances, a member having high stretchability is required.

In Patent Literature 1 describes a method of sealing a semiconductor element such as a memory chip by using a stretchable resin composition. In Patent Literature 1, the application of the stretchable resin composition with respect to a sealing application is mainly considered.

CITATION LIST

Patent Literature

Patent Literature 1: WO2016/080346

SUMMARY OF INVENTION

Technical Problem

An object of one aspect of the present invention is to provide a stretchable member with a metal foil that is capable of simply forming a stretchable wiring substrate including a metal foil, and is also excellent in adhesion of the metal foil.

Solution to Problem

As a result of intensive studies of the present inventors, it has been found that the object described above is attained by combining a stretchable resin base material and a metal foil having a roughened surface. That is, one aspect of the present invention provides a stretchable member with a metal foil including a stretchable resin base material, and a conductive metal foil provided on the stretchable resin base material. A surface of the metal foil on the stretchable resin base material side is a roughened surface having surface roughness Ra of 0.1 µm to 3 µm.

Advantageous Effects of Invention

The stretchable member with a metal foil according to one aspect of the present invention can be simply manufactured by providing the stretchable resin base material on the roughened surface side of the metal foil. In addition, adhesion between the metal foil and the stretchable resin base material is also excellent.

DESCRIPTION OF EMBODIMENTS

Hereinafter, some embodiments of the present invention will be described in detail. However, the present invention is not limited to the following embodiments.

Figure 1:
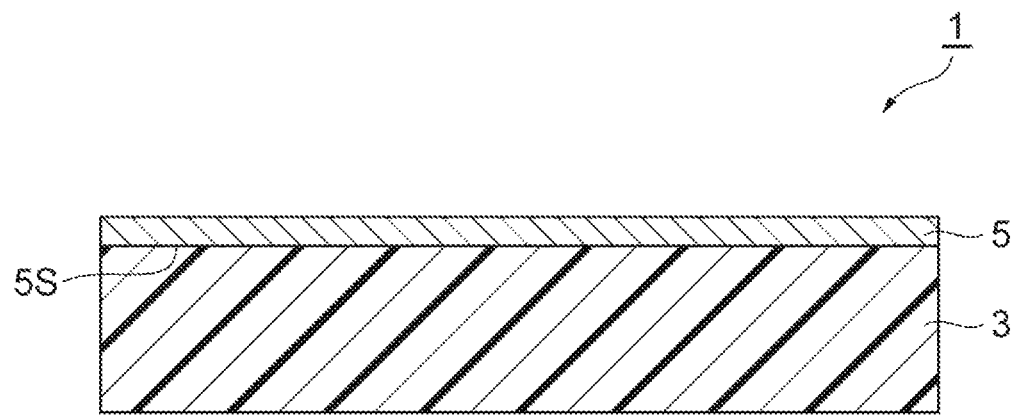
FIG. 1 is a sectional view illustrating an embodiment of a stretchable member with a metal foil.

FIG. 1 is a sectional view illustrating an embodiment of a stretchable member with a metal foil. A stretchable member with a metal foil 1 illustrated in FIG. 1 includes a stretchable resin base material 3, and a conductive metal foil 5 provided on the stretchable resin base material 3.

The metal foil 5, for example, can be at least one kind selected from a titanium foil, a stainless steel foil, a nickel foil, a permalloy foil, a 42 alloy foil, a kovar foil, a nichrome foil, a copper foil, a beryllium copper foil, a phosphor copper foil, a brass foil, a nickel silver foil, an aluminum foil, a tin foil, a lead foil, a zinc foil, a solder foil, an iron foil, a tantalum foil, a niobium foil, a molybdenum foil, a zirconium foil, a gold foil, a silver foil, a palladium foil, a monel foil, an inconel foil, and a hastelloy foil. The metal foil 5, for example, may be a copper foil that is capable of simply forming a wiring pattern by photolithography without impairing the properties of the stretchable resin base material.

The copper foil is not particularly limited, and for example, an electrolytic copper foil or a rolled copper foil can be used as the copper foil. From the viewpoint of excellent folding resistance, the copper foil may be a rolled copper foil. Examples of a commercially available electrolytic copper foil include FO-WS-18 (Product Name, manufactured by Furukawa Electric Co., Ltd.), NC-WS-20 (Product Name, manufactured by Furukawa Electric Co., Ltd.), YGP-12 (Product Name, manufactured by Nippon Denkai, Ltd.), GTS-18 (Product Name, manufactured by Furukawa Electric Co., Ltd.), and F2-WS-12 (Product Name, manufactured by Furukawa Electric Co., Ltd.). Examples of the rolled copper foil include a TPC foil (Product Name, manufactured by JX Nippon Mining & Metals Corporation), an HA foil (Product Name, manufactured by JX Nippon Mining & Metals Corporation), an HA-V2 foil (Product Name, manufactured by JX Nippon Mining & Metals Corporation), and C1100R (Product Name, manufactured by MITSUI SUMITOMO METAL MINING BRASS & COPPER CO., LTD.). A copper foil that is treated with a roughening treatment may be used.

A metal foil including a roughened surface 5S that is formed by a roughening treatment is used as the metal foil 5. In a direction in which the roughened surface 5S is in contact with the stretchable resin base material 3, the metal foil 5 is provided on the stretchable resin base material 3. From the viewpoint of adhesion between the stretchable resin base material 3 and the metal foil 5, surface roughness Ra of the roughened surface 5S may be greater than or equal to 0.1 µm, greater than or equal to 0.2 µm, greater than or equal to 0.8 µm, or greater than or equal to 1.0 µm, or may be less than or equal to 3 µm or less than or equal to 2 µm. In addition, the surface roughness Ra of the roughened surface 5S may be 0.1 µm to 3 µm, or 0.2 µm to 2.0 µm. In order to form fine wiring, the surface roughness Ra of the roughened surface 5S may be 0.3 µm to 1.5 µm. In a case where the surface roughness of the roughened surface 5S is greater than or equal to 0.1 µm, the adhesion tends to be more excellent, and in a case where the surface roughness of the roughened surface 5S is less than or equal to 3 µm, wiring formability and frequency properties tend to be excellent.

The surface roughness Ra, for example, can be measured with a surface shape measurement device Wyko NT9100 (manufactured by Veeco Instruments Inc.) in the following conditions.

Measurement Conditions
Internal Lens: 1 Time
External Lens: 50 Times
Measurement Range: 0.120×0.095 mm
Measurement Depth: 10 µm
Measurement Mode: Vertical Scanning Interference Mode (VSI Mode)

The thickness of the metal foil 5 is not particularly limited, but may be 1µ to 50µ. In a case where the thickness of the metal foil 5 is greater than or equal to 1 µm, it is possible to more easily form the wiring pattern. In a case where the thickness of the metal foil 5 is less than or equal to 50 µm, it is easy to perform etching and handling.

The metal foil 5 is provided on one surface or both surfaces of the stretchable resin base material 3. Providing the metal foil 5 on both surfaces of the stretchable resin base material 3 can result in suppressed warpage of the member at the time of curing. A method of providing the metal foil 5 is not particularly limited, but it includes a method of directly applying a resin composition for forming the stretchable resin base material 3 onto the metal foil 5, a method of applying the resin composition for forming the stretchable resin base material 3 onto a carrier film to form a resin layer, and laminating the formed resin layer on the metal foil 5.

A recovery rate after the stretchable resin base material 3 is subjected to tensile deformation up to strain of 20% may be greater than or equal to 80%. In a tensile test at a room temperature (25° C.) using a test piece of a stretchable resin base material of a length L1, when the test piece has a length L2 after it is subjected to tensile deformation up to strain of 20% and then restored, the recovery rate of the stretchable resin base material can be obtained by Expression: Recovery Rate (%)=(L2/L1)×100.

Figure 3:
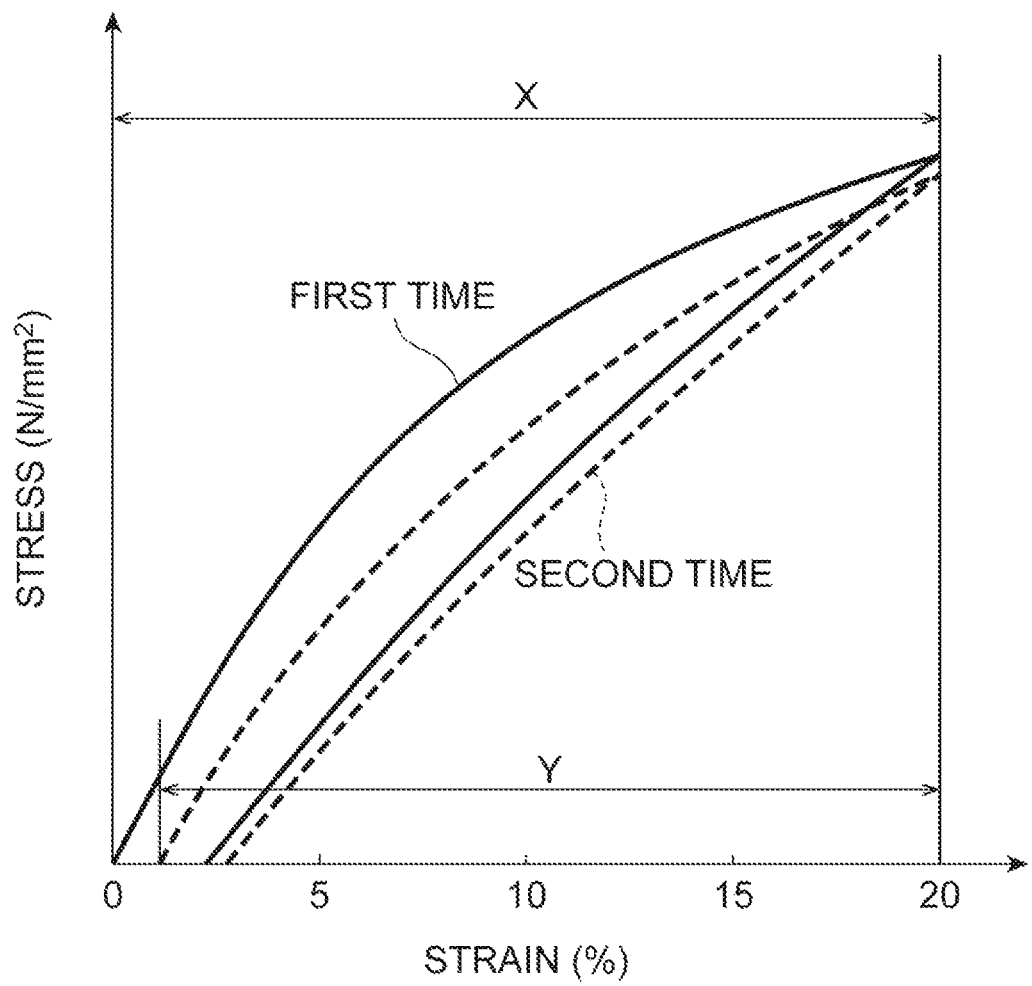
FIG. 3 is a stress-strain curve illustrating a measurement example of a recovery rate.

More specifically, R that is calculated by Expression: R=(Y/X)×100 can be defined as the recovery rate, when, in the tensile test using the test piece of the stretchable resin base material, strain (a displacement amount) applied to the test piece that is retained by chucks in the first tensile test is set to X, and then, a difference between: strain (a displacement amount) at a position where a load is started to be applied (a load rising position) when the second tensile test is performed after the chucks are returned to the initial position; and X (for Example, 20%), is set to Y. The recovery rate may be greater than or equal to 80%. FIG. 3 is a stress-strain curve illustrating a measurement example of a recovery rate. In a case where the recovery rate is greater than or equal to 80%, resistance properties against repeated use tend to increase. From the same reason, the recovery rate may be greater than or equal to 85%, or greater than or equal to 90%.

The stretchable resin base material, and the resin composition for forming the stretchable resin base material can contain (A) a rubber component. The rubber component can mainly lead to stretchability of the stretchable resin base material easily. The content of the rubber component may be 30 mass % to 100 mass % with respect to the mass of the stretchable resin base material, or the resin composition for forming the stretchable resin base material.

The rubber component, for example, may be at least one kind selected from acrylic rubber, isoprene rubber, butyl rubber, styrene butadiene rubber, butadiene rubber, acrylonitrile butadiene rubber, silicone rubber, urethane rubber, chloroprene rubber, ethylene propylene rubber, fluorine rubber, sulfurized rubber, epichlorohydrin rubber, and chlorinated butyl rubber. From the viewpoint of protecting wiring from damage due to moisture absorption or the like, gas permeability of the rubber component may be low. From this viewpoint, the rubber component may be at least one kind selected from styrene butadiene rubber, butadiene rubber, and butyl rubber.

Examples of commercially available products of the acrylic rubber include "Nipol AR series" manufactured by Zeon Corporation, and "Kurarity series" manufactured by KURARAY CO., LTD.

Examples of commercially available products of the isoprene rubber include "Nipol IR series" manufactured by Zeon Corporation.

Examples of commercially available products of the butyl rubber include "BUTYL series" manufactured by JSR Corporation.

Examples of commercially available products of the styrene butadiene rubber "DYNARON SEBS series" and "DYNARON HSBR series" manufactured by JSR Corporation, "Kraton D Polymer series" manufactured by KRATON CORPORATION, and "AR series" manufactured by ARONKASEI CO., LTD.

Examples of commercially available products of the butadiene rubber include "Nipol BR series" manufactured by Zeon Corporation.

Examples of commercially available products of the acrylonitrile butadiene rubber include "JSR NBR series" manufactured by JSR Corporation.

Examples of commercially available products of the silicone rubber include "KMP series" manufactured by Shin-Etsu Chemical Co., Ltd.

Examples of commercially available products of the ethylene propylene rubber include "JSR EP series" manufactured by JSR Corporation.

Examples of commercially available products of the fluorine rubber include "DAI-EL series" manufactured by Daikin Industries, Ltd.

Examples of commercially available products of the epichlorohydrin rubber include "Hydrin series" manufactured by Zeon Corporation.

The rubber component can be also prepared by synthesis. For example, the acrylic rubber can be obtained by the reaction of a (meth)acrylic acid, (meth)acrylic ester, an aromatic vinyl compound, a vinyl cyanide compound, and the like.

The stretchable resin base material 3 may further contain a cross-linking polymer of (B) a cross-linking component. In other words, the resin composition (a curable resin composition) for forming the stretchable resin base material 3 may contain (B) the cross-linking component. A resin composition containing the cross-linking component is cured by a cross-linking reaction of the cross-linking component, and thus, is capable of forming the stretchable resin base material containing the cross-linking polymer. The cross-linking component, for example, may be a compound having a reactive group of at least one kind selected from the group consisting of a (meth)acryl group, a vinyl group, an epoxy group, a styryl group, an amino group, an isocyanurate group, a ureide group, a cyanate group, an isocyanate group, and a mercapto group. One kind of such compounds can be used, or two or more types thereof can be combined.

Examples of a compound having a (meth)acryl group include a (meth)acrylate compound. The (meth)acrylate compound may be any one of monofunctional (meth)acrylate, difunctional (meth)acrylate, and polyfunctional (meth)acrylate, but is not particularly limited, and may be difunctional or polyfunctional (meth)acrylate in order to obtain sufficient curing properties.

Examples of the monofunctional (meth)acrylate include aliphatic (meth)acrylate such as methyl (meth)acrylate, ethyl (meth)acrylate, butyl (meth)acrylate, isobutyl (meth)acrylate, tert-butyl (meth)acrylate, buthoxy ethyl (meth)acrylate, isoamyl (meth)acrylate, hexyl (meth)acrylate, 2-ethyl hexyl (meth)acrylate, heptyl (meth)acrylate, octyl heptyl (meth) acrylate, nonyl (meth)acrylate, decyl (meth)acrylate, undecyl (meth)acrylate, lauryl (meth)acrylate, tridecyl (meth)acrylate, tetradecyl (meth)acrylate, pentadecyl (meth) acrylate, hexadecyl (meth)acrylate, stearyl (meth)acrylate, behenyl (meth)acrylate, 2-hydroxy ethyl (meth)acrylate, 2-hydroxy propyl (meth)acrylate, 3-chloro-2-hydroxy propyl (meth)acrylate, 2-hydroxy butyl (meth)acrylate, methoxy polyethylene glycol (meth)acrylate, ethoxy polyethylene glycol (meth)acrylate, methoxy polypropylene glycol (meth)acrylate, ethoxy polypropylene glycol (meth) acrylate, and mono(2-(meth)acryloyloxy ethyl) succinate; alicyclic (meth)acrylate such as cyclopentyl (meth)acrylate, cyclohexyl (meth)acrylate, cyclopentyl (meth)acrylate, dicyclopentanyl (meth)acrylate, dicyclopentenyl (meth) acrylate, isobornyl (meth)acrylate, mono(2-(meth)acryloyloxy ethyl) tetrahydrophthalate, and mono(2-(meth)acryloyloxy ethyl) hexahydrophthalate; aromatic (meth)acrylate such as benzyl (meth)acrylate, phenyl (meth)acrylate, o-biphenyl (meth)acrylate, 1-naphtyl (meth)acrylate, 2-naphtyl (meth)acrylate, phenoxy ethyl (meth)acrylate, p-cumyl phenoxy ethyl (meth)acrylate, o-phenyl phenoxy ethyl (meth) acrylate, 1-naphthoxy ethyl (meth)acrylate, 2-naphthoxy ethyl (meth)acrylate, phenoxy polyethylene glycol (meth) acrylate, nonyl phenoxy polyethylene glycol (meth)acrylate, phenoxy polypropylene glycol (meth)acrylate, 2-hydroxy-3-phenoxy propyl (meth)acrylate, 2-hydroxy-3-(o-phenyl phenoxy) propyl (meth)acrylate, 2-hydroxy-3-(1-naphthoxy) propyl (meth)acrylate, 2-hydroxy-3-(2-naphthoxy) propyl (meth)acrylate; heterocyclic (meth)acrylate such as 2-tetrahydrofurfuryl (meth)acrylate, N-(meth)acryloyloxy ethyl hexahydrophthalimide, and 2-(meth)acryloyloxy ethyl-N-carbazole, and a caprolactone modified product thereof. From the viewpoint of compatibility with respect to a styrene-based elastomer, or transparency and heat resistance, the monofunctional (meth)acrylate may be at least one kind selected from the aliphatic (meth)acrylate and the aromatic (meth)acrylate.

Examples of the difunctional (meth)acrylate include aliphatic (meth)acrylate such as ethylene glycol di(meth)acrylate, diethylene glycol di(meth)acrylate, triethylene glycol di(meth)acrylate, tetraethylene glycol di(meth)acrylate, polyethylene glycol di(meth)acrylate, propylene glycol di(meth)acrylate, dipropylene glycol di(meth)acrylate, tripropylene glycol di(meth)acrylate, tetrapropylene glycol di(meth)acrylate, polypropylene glycol di(meth)acrylate, ethoxylated polypropylene glycol di(meth)acrylate, 1,3-butanediol di(meth)acrylate, 1,4-butanediol di(meth)acrylate, neopentyl glycol di(meth)acrylate, 3-methyl-1,5-pentanediol di(meth)acrylate, 1,6-hexanediol di(meth)acrylate, 2-butyl-2-ethyl-1,3-propanediol di(meth)acrylate, 1,9-nonanediol di(meth)acrylate, 1,10-decanediol di(meth)acrylate, glycerin di(meth)acrylate, tricyclodecane dimethanol (meth)acrylate, and ethoxylated 2-methyl-1,3-propanediol di(meth)acrylate; alicyclic (meth)acrylate such as cyclohexane dimethanol (meth)acrylate, ethoxylated cyclohexane dimethanol (meth)acrylate, propoxylated cyclohexane dimethanol (meth)acrylate, ethoxylated propoxylated cyclohexane dimethanol (meth)acrylate, tricyclodecane dimethanol (meth)acrylate, ethoxylated tricyclodecane dimethanol (meth)acrylate, propoxylated tricyclodecane dimethanol (meth)acrylate, ethoxylated propoxylated tricyclodecane dimethanol (meth)acrylate, ethoxylated hydrogenated bisphenol A di(meth)acrylate, propoxylated hydrogenated bisphenol A di(meth)acrylate, ethoxylated propoxylated hydrogenated bisphenol A di(meth)acrylate, ethoxylated hydrogenated bisphenol F di(meth)acrylate, propoxylated hydrogenated bisphenol F di(meth)acrylate, and ethoxylated propoxylated hydrogenated bisphenol F di(meth)acrylate; aromatic (meth)acrylate such as ethoxylated bisphenol A di(meth)acrylate, propoxylated bisphenol A di(meth)acrylate, ethoxylated propoxylated bisphenol A di(meth)acrylate, ethoxylated bisphenol F di(meth)acrylate, propoxylated bisphenol F di(meth)acrylate, ethoxylated propoxylated bisphenol F di(meth)acrylate, ethoxylated bisphenol AF di(meth)acrylate, propoxylated bisphenol AF di(meth)acrylate, ethoxylated propoxylated bisphenol AF di(meth)acrylate, ethoxylated fluorene type di(meth)acrylate, propoxylated fluorene type di(meth)acrylate, and ethoxylated propoxylated fluorene type di(meth)acrylate; heterocyclic (meth)acrylate such as ethoxylated isocyanurate di(meth)acrylate, propoxylated isocyanurate di(meth)acrylate, and ethoxylated propoxylated isocyanurate di(meth)acrylate; a caprolactone modified product thereof; aliphatic epoxy (meth)acrylate such as neopentyl glycol type epoxy (meth)acrylate; alicyclic epoxy (meth)acrylate such as cyclohexane dimethanol type epoxy (meth)acrylate, hydrogenated bisphenol A type epoxy (meth)acrylate, and hydrogenated bisphenol F type epoxy (meth)acrylate; aromatic epoxy (meth)acrylate such as resorcinol type epoxy (meth)acrylate, bisphenol A type epoxy (meth)acrylate, bisphenol F type epoxy (meth) acrylate, bisphenol AF type epoxy (meth)acrylate, and fluorene type epoxy (meth)acrylate, and the like. From the viewpoint of the compatibility with respect to the styrene-based elastomer, or the transparency and the heat resistance, the difunctional (meth)acrylate may be at least one kind selected from the aliphatic (meth)acrylate and the aromatic (meth)acrylate.

Examples of tri- or higher polyfunctional (meth)acrylate include aliphatic (meth)acrylate such as trimethylol propane tri(meth)acrylate, ethoxylated trimethylol propane tri(meth) acrylate, propoxylated trimethylol propane tri(meth)acrylate, ethoxylated propoxylated trimethylol propane tri(meth) acrylate, pentaerythritol tri(meth)acrylate, ethoxylated pentaerythritol tri(meth)acrylate, propoxylated pentaerythritol tri(meth)acrylate, ethoxylated propoxylated pentaerythritol tri(meth)acrylate, pentaerythritol tetra(meth)acrylate, ethoxylated pentaerythritol tetra(meth)acrylate, propoxylated pentaerythritol tetra(meth)acrylate, ethoxylated propoxylated pentaerythritol tetra(meth)acrylate, ditrimethylol propane tetraacrylate, and dipentaerythritol hexa(meth)

acrylate; heterocyclic (meth)acrylate such as ethoxylated isocyanurate tri(meth)acrylate, propoxylated isocyanurate tri(meth)acrylate, and ethoxylated propoxylated isocyanurate tri(meth)acrylate; a caprolactone modified product thereof; and aromatic epoxy (meth)acrylate such as phenol novolac type epoxy (meth)acrylate and cresol novolac type epoxy (meth)acrylate. From the viewpoint of the compatibility with respect to the styrene-based elastomer, or the transparency and the heat resistance, the tri- or higher polyfunctional (meth)acrylate may be at least one kind selected from the aliphatic (meth)acrylate and the aromatic (meth)acrylate.

One kind of such compounds or two or more types thereof can be combined, and can also be combined with a polymerizable compound having other reactive groups.

The content of the cross-linking polymer formed of the cross-linking component may be 10 mass % to 50 mass %, on the basis of the mass of the stretchable resin base material. In a case where the content of the cross-linking polymer formed of the cross-linking component is in the range described above, adhesion of the stretchable resin base material against the metal foil tends to be improved while maintaining the properties of the stretchable resin base material. From the above viewpoint, the content of the cross-linking polymer formed of the cross-linking component may be 15 mass % to 40 mass %.

The resin composition for forming the stretchable resin base material may contain a polymerization initiator. The polymerization initiator is not particularly limited insofar as starting the polymerization of the cross-linking component by heating or irradiation of an ultraviolet ray or the like, and for example, a thermal radical polymerization initiator or a photoradical polymerization initiator can be used. The thermal radical initiator is capable of making the progress of the reaction uniform. The photoradical initiator is capable of performing normal temperature curing, and thus, is capable of preventing the device from being degraded due to heat, and of suppressing the warpage of the member.

Examples of the thermal radical polymerization initiator include ketone peroxide such as methyl ethyl ketone peroxide, cyclohexanone peroxide, and methyl cyclohexanone peroxide; peroxy ketal such as 1,1-bis(t-butyl peroxy)cyclohexane, 1,1-bis(t-butyl peroxy)-2-methyl cyclohexane, 1,1-bis(t-butyl peroxy)-3,3,5-trimethyl cyclohexane, 1,1-bis(t-hexyl peroxy) cyclohexane, and 1,1-bis(t-hexyl peroxy)-3,3,5-trimethyl cyclohexane; hydroperoxide such as p-methane hydroperoxide; dialkyl peroxide such as α,α'-bis(t-butyl peroxy)diisopropyl benzene, dicumyl peroxide, t-butyl cumyl peroxide, and di-t-butyl peroxide; diacyl peroxide such as octanoyl peroxide, lauroyl peroxide, stearyl peroxide, and benzoyl peroxide; peroxy carbonate such as bis(4-t-butyl cyclohexyl) peroxy dicarbonate, di-2-ethoxy ethyl peroxy dicarbonate, di-2-ethyl hexyl peroxy dicarbonate, and di-3-methoxy butyl peroxy carbonate; peroxy ester such as t-butyl peroxy pivalate, t-hexyl peroxy pivalate, 1,1,3,3-tetramethyl butyl peroxy-2-ethyl hexanoate, 2,5-dimethyl-2,5-bis(2-ethyl hexanoyl peroxy) hexane, t-hexyl peroxy-2-ethyl hexanoate, t-butyl peroxy-2-ethyl hexanoate, t-butyl peroxy isobutyrate, t-hexyl peroxy isopropyl monocarbonate, t-butyl peroxy-3,5,5-trimethyl hexanoate, t-butyl peroxy laurate, t-butyl peroxy isopropyl monocarbonate, t-butyl peroxy-2-ethyl hexyl monocarbonate, t-butyl peroxy benzoate, t-hexyl peroxy benzoate, 2,5-dimethyl-2,5-bis(benzoyl peroxy) hexane, and t-butyl peroxy acetate; and an azo compound such as 2,2'-azobisisobutyronitrile, 2,2'-azobis(2,4-dimethyl valeronitrile), and 2,2'-azobis(4-methoxy-2'-dimethyl valeronitrile). From the viewpoint of the curing properties, the transparency, and the heat resistance, the thermal radical polymerization initiator may be at least one kind selected from the diacyl peroxide, the peroxy ester, and the azo compound.

Examples of the photoradical polymerization initiator include benzoin ketal such as 2,2-dimethoxy-1,2-diphenyl ethan-1-one; α-hydroxy ketone such as 1-hydroxy cyclohexyl phenyl ketone, 2-hydroxy-2-methyl-1-phenyl propan-1-one, and 1-[4-(2-hydroxy ethoxy)phenyl]-2-hydroxy-2-methyl-1-propan-1-one; α-aminoketone such as 2-benzyl-2-dimethyl amino-1-(4-morpholinophenyl)-butan-1-one, and 1,2-methyl-1-[4-(methyl thio)phenyl]-2-morpholinopropan-1-one; oxime ester such as 1-[(4-phenyl thio)phenyl]-1,2-octadione-2-(benzoyl)oxime; phosphine oxide such as bis(2,4,6-trimethyl benzoyl) phenyl phosphine oxide, bis(2,6-dimethoxy benzoyl)-2,4,4-trimethyl pentyl phosphine oxide, and 2,4,6-trimethyl benzoyl diphenyl phosphine oxide; a 2,4,5-triaryl imidazole dimer such as a 2-(o-chlorophenyl)-4,5-diphenyl imidazole dimer, a 2-(o-chlorophenyl)-4,5-di(methoxy phenyl) imidazole dimer, a 2-(o-fluorophenyl)-4,5-diphenyl imidazole dimer, a 2-(o-methoxy phenyl)-4,5-diphenyl imidazole dimer, and a 2-(p-methoxy phenyl)-4,5-diphenyl imidazole dimer; a benzophenone compound such as benzophenone, N,N,N',N'-tetramethyl-4,4'-diaminobenzophenone, N,N,N',N'-tetraethyl-4,4'-diaminobenzophenone, and 4-methoxy-4'-dimethyl aminobenzophenone; a quinone compound such as 2-ethyl anthraquinone, phenanthrenequinone, 2-tert-butyl anthraquinone, octamethyl anthraquinone, 1,2-benzanthraquinone, 2,3-benzanthraquinone, 2-phenyl anthraquinone, 2,3-diphenyl anthraquinone, 1-chloroanthraquinone, 2-methyl anthraquinone, 1,4-naphthoquinone, 9,10-phenanthraquinone, 2-methyl-1,4-naphthoquinone, and 2,3-dimethyl anthraquinone; benzoin ether such as benzoin methyl ether, benzoin ethyl ether, and benzoin phenyl ether; a benzoin compound such as benzoin, methyl benzoin, and ethyl benzoin; a benzyl compound such as benzyl dimethyl ketal; an acridine compound such as 9-phenyl acridine and 1,7-bis(9,9'-acridinyl heptane); N-phenyl glycine, and coumarin.

In the 2,4,5-triaryl imidazole dimer, symmetric compounds that are identical to each other may be applied to a substituent of an aryl group in two triaryl imidazole portions, or asymmetric compounds that are different from each other may be applied. As with the combination of diethyl thioxanthone and dimethyl aminobenzoate, a thioxanthone compound and tertiary amine may be combined.

From the viewpoint of the curing properties, the transparency, and the heat resistance, the photoradical polymerization initiator may be at least one kind selected from α-hydroxy ketone and phosphine oxide. Only one kind of such thermal or photoradical polymerization initiators can be used, or two or more types thereof can be combined. Further, the photoradical polymerization initiator can be combined with a suitable sensitizer.

The content of the polymerization initiator may be 0.1 parts by mass to 10 parts by mass with respect to the total amount of 100 parts by mass of the rubber component and the cross-linking component. In a case where the content of the polymerization initiator is greater than or equal to 0.1 parts by mass, sufficient curing tends to be easily obtained. In a case where the content of the polymerization initiator is less than or equal to 10 parts by mass, sufficient light transmittance tends to be easily obtained. From the above viewpoint, the content of the polymerization initiator may be 0.3 parts by mass to 7 parts by mass, or 0.5 parts by mass to 5 parts by mass.

The stretchable resin base material, and the resin composition for forming the stretchable resin base material may further contain a so-called additive such as an antioxidant, an anti-yellowing agent, an ultraviolet ray absorbent, a visible light absorbent, a coloring agent, a plasticizer, a stabilizer, and a filler, within a range not departing from the gist of the present invention, in addition to the components described above, as necessary.

The stretchable resin base material, for example, can be manufactured by a method including obtaining a resin varnish by dissolving or dispersing the rubber component, and other components as necessary, in an organic solvent, forming a resin layer (or the stretchable resin base material) by applying the resin varnish onto the roughened surface of the metal foil or the carrier film by a method described below, and forming the stretchable resin base material by curing the resin layer as necessary.

The organic solvent used here is not particularly limited, and examples of the organic solvent include aromatic hydrocarbon such as toluene, xylene, mesitylene, cumene, and p-cymene; cyclic ether such as tetrahydrofuran and 1,4-dioxane; ketone such as acetone, methyl ethyl ketone, methyl isobutyl ketone, cyclohexanone, and 4-hydroxy-4-methyl-2-pentanone; ester such as methyl acetate, ethyl acetate, butyl acetate, methyl lactate, ethyl lactate, and γ-butyrolactone; carbonate ester such as ethylene carbonate and propylene carbonate; and amide such as N,N-dimethyl formamide, N,N-dimethyl acetamide, and N-methyl-2-pyrrolidone. From the viewpoint of solubility and a boiling point, the organic solvent may be toluene, N,N-dimethyl acetamide, or a combination thereof. Only one kind of such organic solvents can be used, or two or more types thereof can be used by being combined. A solid content (a component other than the organic solvent) concentration in the resin varnish may be typically 20 mass % to 80 mass %.

The carrier film is not particularly limited, and for example, may be a film containing at least one kind of resin selected from polyester such as polyethylene terephthalate (PET), polybutylene terephthalate, and polyethylene naphthalate; polyolefin such as polyethylene and polypropylene; polycarbonate, polyamide, polyimide, polyamide imide, polyether imide, polyether sulfide, polyether sulfone, polyether ketone, polyphenylene ether, polyphenylene sulfide, polyarylate, polysulfone, and a liquid crystal polymer. From the viewpoint of flexibility and elasticity, the carrier film may be a film of polyethylene terephthalate, polybutylene terephthalate, polyethylene naphthalate, polypropylene, polycarbonate, polyamide, polyimide, polyamide imide, polyphenylene ether, polyphenylene sulfide, polyarylate, or polysulfone.

The thickness of the carrier film is not particularly limited, and may be 3 μm to 250 μm. In a case where the thickness of the carrier film is greater than or equal to 3 μm, a film strength is sufficient, and in a case where the thickness of the carrier film is less than or equal to 250 μm, sufficient flexibility is obtained. From the above viewpoint, the thickness of the carrier film may be 5 μm to 200 μm, or 7 μm to 150 μm. From the viewpoint of improving peeling properties of the resin layer or the stretchable resin base material, a film in which a release treatment is subjected to a member film with a silicone-based compound, a fluorine-containing compound, or the like may be used as necessary.

A protective film is put onto the resin layer or the stretchable resin base material as necessary, to obtain a laminated film of a three-layer structure including the metal foil (a copper foil) or the carrier film, the resin layer or the stretchable resin base material, and the protective film.

The protective film is not particularly limited, and for example, may be a film containing a resin selected from polyester such as polyethylene terephthalate, polybutylene terephthalate, and polyethylene naphthalate; and polyolefin such as polyethylene and polypropylene. From the viewpoint of the flexibility and the elasticity, the protective film may be a film of polyester such as polyethylene terephthalate, or polyolefin such as polyethylene and polypropylene. From the viewpoint of improving peeling properties against the resin layer or the stretchable resin base material, the surface of the protective film may be subjected to a release treatment with a silicone-based compound, a fluorine-containing compound, or the like.

The thickness of the protective film may be suitably changed according to desired flexibility, and may be 10 μm to 250 μm. In a case where the thickness of the protective film is greater than or equal to 10 μm, a film strength tends to be sufficient, and in a case where the thickness of the protective film is less than or equal to 250 μm, sufficient flexibility tends to be obtained. From the above viewpoint, the thickness of the protective film may be 15 μm to 200 μm, or 20 μm to 150 μm.

A method of laminating the resin layer or the stretchable resin base material that is formed on the carrier film on the metal foil is not particularly limited, and for example, a roll laminator, a vacuum laminator, a vacuum press, and the like are used. From the viewpoint of a production efficiency, the roll laminator or the vacuum laminator may be used.

The thickness of the resin layer or the stretchable resin base material is not particularly limited, and may be generally 5 μm to 1000 μm. In the range described above, a sufficient strength of the stretchable member is easily obtained, and drying is sufficiently performed, and thus, it is possible to reduce a residual solvent amount in the resin layer or the stretchable resin base material.

Figure 2:
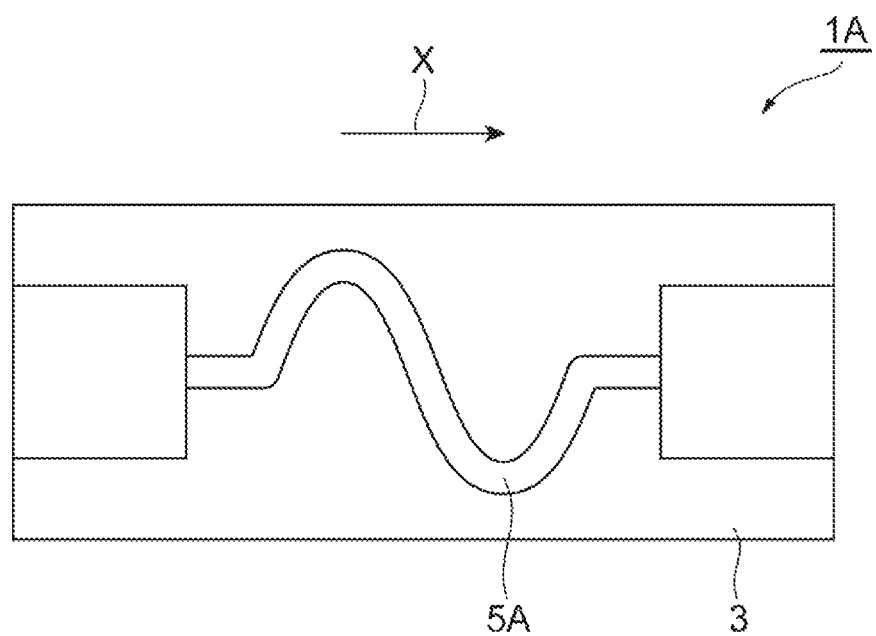
FIG. 2 is a sectional view illustrating an embodiment of a wiring substrate.

With forming the metal foil of the stretchable member with a metal foil into a wiring pattern, a wiring substrate having stretchability can be obtained. FIG. 2 is a plan view illustrating an embodiment of the wiring substrate. A wiring substrate 1A illustrated in FIG. 2 includes a stretchable resin base material 3, a wiring pattern 5A provided on the stretchable resin base material 3, and for example, is capable of stretching in a direction along an arrow X. A method of obtaining the wiring substrate by forming the metal foil of the stretchable member with a metal foil into the wiring pattern, for example, can include a step of forming an etching resist on the metal foil of the stretchable member with a metal foil, a step of exposing the etching resist, developing the etching resist after the expose to form a resist pattern covering a part of the metal foil, a step of removing the metal foil in a portion that is not covered with the resist pattern to form the wiring pattern on the metal foil, and a step of removing the resist pattern.

Examples of an etching solution include a mixed solution of a concentrated sulfuric acid and a hydrogen peroxide solution, and a ferric chloride solution.

Examples of the etching resist used in the etching include PHOTEC H-7025 (Product Name, manufactured by Hitachi Chemical Company, Ltd.) and PHOTEC H-7030 (Product Name, manufactured by Hitachi Chemical Company, Ltd.), and X-87 (Product Name, manufactured by TAIYO HOLDINGS CO., LTD.).

Figure 4:
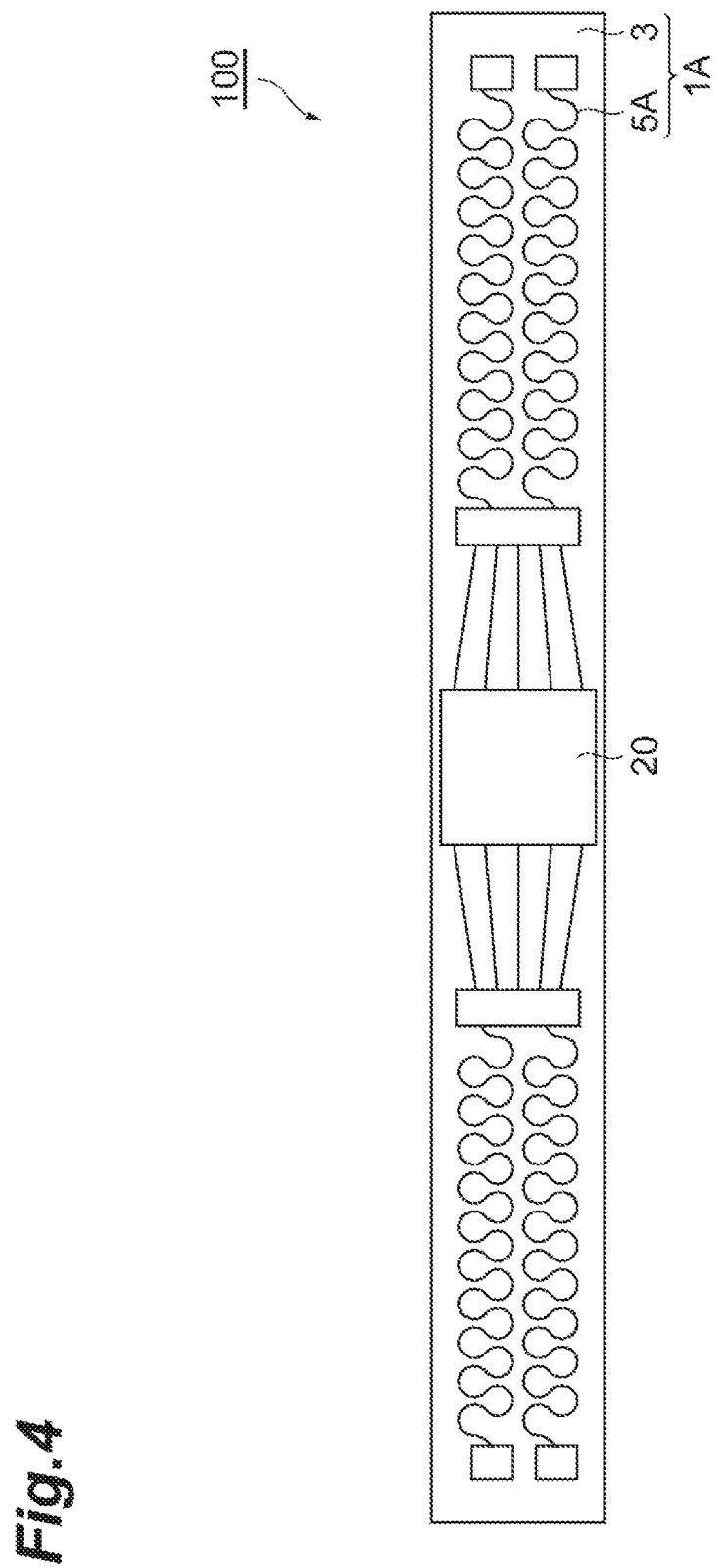
FIG. 4 is a plan view illustrating an embodiment of a stretchable device.

It is possible to obtain a stretchable device by mounting various electronic elements on the wiring substrate. FIG. 4 is a plan view illustrating one embodiment of the stretchable device. A stretchable device 100 illustrated in FIG. 4 includes the wiring substrate 1A including the stretchable resin base material 3 and the wiring pattern 5A provided on the stretchable resin base material 3, and an electronic element 20 mounted on the wiring substrate 1A. The wiring pattern 5A is formed by removing a part of the metal foil 5 of the stretchable member with a metal foil 1 described above.

An elastic modulus of the stretchable resin base material may be greater than or equal to 0.1 MPa and less than or equal to 1000 MPa at 25° C. In a case where the elastic modulus of the stretchable resin base material is greater than or equal to 0.1 MPa and less than or equal to 1000 MPa, handleability and flexibility as the member tend to be particularly excellent. From such a viewpoint, the elastic modulus of the stretchable resin base material may be greater than or equal to 0.3 MPa and less than or equal to 100 MPa, or greater than or equal to 0.5 MPa and less than or equal to 50 MPa.

An elongation at break of the stretchable resin base material may be greater than or equal to 100% at 25° C. In a case where the elongation at break of the stretchable resin base material is greater than or equal to 100%, sufficient stretchability tends to be easily obtained. From such a viewpoint, the elongation at break of the stretchable resin base material may be greater than or equal to 300%, or may be greater than or equal to 500%. The upper limit of the elongation at break of the stretchable resin base material is not particularly limited, and for Example, may be less than or equal to 1000%.

EXAMPLES

Hereinafter, the present invention will be described in detail by using examples. However, the present invention is not limited to the examples.

Example 1

Preparation of Resin Varnish 20 g of hydrogenated styrene butadiene rubber (DYNARON 2324P, Product Name, manufactured by JSR Corporation) as the rubber component, 5 g of nonanediol diacrylate (FANCRYL FA-129AS, Product Name, manufactured by Hitachi Chemical Company, Ltd.) as the cross-linking component, and 0.4 g of bis(2,4,6-trimethyl benzoyl) phenyl phosphine oxide (Irgacure 819, Product Name, manufactured by BASF Japan Co., Ltd.) as the polymerization initiator were mixed while being stirred with 15 g of toluene as the solvent, and thus, a resin varnish was obtained.

Preparation of Stretchable Resin Composition

A polyethylene terephthalate (PET) film ("Purex A31" manufactured by Teijin DuPont Films Co., Ltd., a thickness of 25 µm) subjected to a release treatment was prepared as the carrier film. The resin varnish was applied onto the surface subjected to the release treatment of the PET film, by using a knife coater ("SNC-350" manufactured by Yasui Seiki Company Ltd.). The coated film was dried by being heated at 100° C. for 20 minutes in a dryer ("MSO-80TPS" manufactured by FUTABA Co., Ltd.), and thus, a resin layer having a thickness of 100 µm was formed. A PET film subjected to the release treatment as with the carrier film was put onto the formed resin layer in a direction in which the surface subjected to the release treatment was on the resin layer side, as the protective film, and thus, a laminated film was obtained.

Preparation of Stretchable Member with Metal Foil

The protective film of the laminated film was peeled off, a rolled copper foil (BHY-HA-V2-18, Product Name, manufactured by JX Nippon Mining & Metals Corporation) with a roughened surface having surface roughness Ra of 0.1 µm, as the conductor foil, was placed on the exposed resin layer in a direction in which the roughened surface was on the resin layer side. In this state, an electrolytic copper foil was laminated on the resin layer by using a vacuum pressurization type laminator ("V130", manufactured by Nikko-Materials Co., Ltd.), in a condition where a pressure was 0.5 MPa, a temperature was 90° C., and a pressurization time was 60 seconds. After that, 2000 mJ/cm$^2$ of an ultraviolet ray (a wavelength of 365 nm) was emitted by an ultraviolet ray exposure machine ("ML-320FSAT", manufactured by Mikasa Co., Ltd.), and thus, the resin layer was photo-cured, and a stretchable member with a metal foil including a stretchable resin base material that is a cured material of the resin layer, and the rolled copper foil was obtained.

Example 2

A stretchable member with a metal foil was obtained as with Example 1 except that an electrolytic copper foil (F2-WS-12, Product Name, manufactured by Furukawa Electric Co., Ltd.) with a roughened surface having surface roughness Ra of 1.5 µm was used as the conductor foil.

Example 3

A stretchable member with a metal foil was obtained as with Example 1 except that an electrolytic copper foil (GTS-35, Product Name, manufactured by Furukawa Electric Co., Ltd.) with a roughened surface having surface roughness Ra of 2.8 µm was used as the conductor foil.

Comparative Example 1

A stretchable member with a metal foil was prepared as with Example 1 except that a rolled copper foil (GHY5-HA-V2, Product Name, manufactured by JX Nippon Mining & Metals Corporation) was laminated on the resin layer in a direction in which a glossy surface (Surface Roughness Ra: 0.04 µm) was on the resin layer side.

Adhesion Evaluation of Conductor Layer (Peeling Strength at 90 Degrees)

A peeling strength at 90 degrees was measured according to a peeling test of peeling the copper foil from the stretchable member with a metal foil at a peeling angle of 90 degrees.

Adhesion Evaluation at Extension

The adhesion between the metal foil and the stretchable member was observed after the stretchable member with a metal foil was subjected to tensile deformation of 50% and then restored. The presence or absence of separation between the stretchable resin base material and the metal foil was investigated, and a case where there is no peeling was set to "A", and a case where there was peeling was set to "C".

Table 1 shows an evaluation result. It was confirmed that the stretchable member with a metal foil of each of the examples was capable of being simply manufactured, and the adhesion between the metal foil and the stretchable resin base material was also excellent.

TABLE 1

|  | Ex. 1 | Ex. 2 | Ex. 3 | Comp. Ex. 1 |
|---|---|---|---|---|
| Surface roughness of surface of copper foil on stretchable resin base material side (μm) | 0.1 | 1.5 | 2.8 | 0.04 |
| Peeling strength at 90 degrees (kN/m) | 0.5 | 1.6 | 2.5 | 0.2 |
| Adhesion at extension | A | A | A | C |

REFERENCE SIGNS LIST

1: stretchable member with metal foil, 1A: wiring substrate, 3: stretchable resin base material, 5: metal foil, 5A: wiring pattern, 5S: roughened surface, 20: electronic element, 100: stretchable device.

The invention claimed is:

1. A stretchable member with a metal foil, comprising:
a stretchable resin base material; and
a conductive metal foil provided on the stretchable resin base material,
wherein a surface of the metal foil on the stretchable resin base material side is a roughened surface having surface roughness Ra of 0.1 μm to 3 μm, and
a recovery rate after the stretchable resin base material is subjected to tensile deformation up to strain of 20% is greater than or equal to 80%.

2. The stretchable member with a metal foil according to claim 1,
wherein the metal foil is a copper foil.

3. The stretchable member with a metal foil according to claim 1,
wherein the stretchable resin base material contains (A) a rubber component, and
the rubber component includes at least one kind selected from the group consisting of acrylic rubber, isoprene rubber, butyl rubber, styrene butadiene rubber, butadiene rubber, acrylonitrile butadiene rubber, silicone rubber, urethane rubber, chloroprene rubber, ethylene propylene rubber, fluorine rubber, sulfurized rubber, epichlorohydrin rubber, and chlorinated butyl rubber.

4. The stretchable member with a metal foil according to claim 3,
wherein a content of the rubber component is 30 mass % to 100 mass % with respect to a mass of the stretchable resin base material.

5. The stretchable member with a metal foil according to claim 3,
wherein the stretchable resin base material further contains a cross-linking polymer of (B) a cross-linking component.

6. The stretchable member with a metal foil according to claim 5,
wherein the cross-linking component is a compound having a reactive group of at least one kind selected from the group consisting of a (meth)acryl group, a vinyl group, an epoxy group, a styryl group, an amino group, an isocyanurate group, an ureide group, a cyanate group, an isocyanate group, and a mercapto group.

7. A stretchable device comprising:
a wiring substrate formed by forming the metal foil of the stretchable member with a metal foil according to claim 1 into a wiring pattern; and
an electronic element mounted on the wiring substrate.

8. A method of manufacturing a wiring substrate including a stretchable resin base material, and a metal foil being formed into a wiring pattern, the method comprising:
forming an etching resist on the metal foil of the stretchable member with a metal foil according to claim 1;
exposing the etching resist, developing the etching resist after exposure, and thereby forming a resist pattern covering a part of the metal foil;
removing the metal foil in a portion that is not covered with the resist pattern, and thereby forming the metal foil into the wiring pattern; and
removing the resist pattern.

* * * * *